US009230921B2

(12) United States Patent
Ayotte et al.

(10) Patent No.: US 9,230,921 B2
(45) Date of Patent: Jan. 5, 2016

(54) SELF-HEALING CRACK STOP STRUCTURE

(71) Applicant: INTERNATIONAL BUSINESS MACHINES CORPORATION, Armonk, NY (US)

(72) Inventors: Stephen P. Ayotte, Bristol, VT (US); Alissa R. Cote, Winooski, VT (US); Kendra A. Lyons, Burlington, VT (US); John C. Malinowski, Jericho, VT (US); Benjamin J. Pierce, Winooski, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 32 days.

(21) Appl. No.: 14/048,838

(22) Filed: Oct. 8, 2013

(65) Prior Publication Data
US 2015/0097271 A1    Apr. 9, 2015

(51) Int. Cl.
*H01L 23/00* (2006.01)
*H01L 21/311* (2006.01)
*H01L 21/3105* (2006.01)
*H01L 21/02* (2006.01)
*H01L 23/31* (2006.01)

(52) U.S. Cl.
CPC ........ *H01L 23/564* (2013.01); *H01L 21/02118* (2013.01); *H01L 21/3105* (2013.01); *H01L 21/31111* (2013.01); *H01L 23/562* (2013.01); *H01L 23/3192* (2013.01); *H01L 2924/0002* (2013.01)

(58) Field of Classification Search
CPC ... H01L 21/48; H01L 21/50; H01L 21/67126; H01L 21/67376; H01L 23/02; H01L 23/10; H01L 23/3142; H01L 24/00; H01L 25/00; H01L 51/524; H01L 2224/83951; H01L 2924/163; H01L 2924/173; H01L 2924/183; H01L 27/32–27/326; H01L 51/50–51/5012; H01L 51/05
See application file for complete search history.

(56) References Cited

U.S. PATENT DOCUMENTS

| 6,975,017 | B2 | 12/2005 | Towle et al. |
| 7,045,562 | B2 | 5/2006 | Thiel |
| 7,952,212 | B2 | 5/2011 | Chakrapani et al. |
| 8,138,599 | B2 | 3/2012 | Megahed |
| 8,148,829 | B2 | 4/2012 | Hu |
| 2002/0024115 | A1* | 2/2002 | Ibnabdeljalil ......... H01L 23/562 257/620 |
| 2004/0198023 | A1 | 10/2004 | Luo et al. |

(Continued)

FOREIGN PATENT DOCUMENTS

KR    101019706 B1    2/2011

OTHER PUBLICATIONS

Disclosed Anonymously, "Method for a self-crack-mending polymer for underfill technology in IC packaging", IP.com Electronic Publication, May 15, 2002, 1 page.

(Continued)

*Primary Examiner* — Steven Loke
*Assistant Examiner* — Samuel Park
(74) *Attorney, Agent, or Firm* — Anthony Canale; Andrew M. Calderon; Roberts Mlotkowski Safran & Cole, P.C.

(57) ABSTRACT

A self-healing crack stop structure and methods of manufacture are disclosed herein. The structure comprises a crack stop structure formed in one or more dielectric layers and surrounding an active region of an integrated circuit chip. The crack stop comprises self healing material which, upon propagation of a crack, is structured to seal the crack and prevent further propagation of the crack.

14 Claims, 3 Drawing Sheets

(56) References Cited

U.S. PATENT DOCUMENTS

| | | |
|---|---|---|
| 2007/0029653 A1 | 2/2007 | Lehman, Jr. et al. |
| 2012/0196373 A1* | 8/2012 | Odom .................... G01N 21/78 436/2 |
| 2013/0181329 A1* | 7/2013 | Wada .................... H01L 23/562 257/620 |
| 2014/0097430 A1* | 4/2014 | Park .................... H01L 27/1218 257/48 |
| 2014/0098005 A1* | 4/2014 | Kim ...................... G06F 3/1446 345/1.3 |

OTHER PUBLICATIONS

Disclosed Anonymously, "Self-Healing Under-Fill Material", IP.com Electronic Publication, Dec. 17, 2003, 3 pages.

* cited by examiner

SELF-HEALING CRACK STOP STRUCTURE

FIELD OF THE INVENTION

The invention relates to semiconductor structures and, more particularly, to a self-healing crack stop structure and methods of manufacture.

BACKGROUND

Crack stops, guard rings and other moisture oxidation barriers (MOB) are structures fabricated along the perimeter of an integrated circuit chip to prevent delamination of the various layers of the integrated circuit chip and other edge damage that may occur during "dicing" of individual integrated circuit chips. The guard rings and MOBs are sometimes referred to as crack stops. These structures can protect the active area of the chip from moisture, mobile ions, and mechanical damage. For example, the guard rings can prevent moisture from corroding the structures on the integrated circuit chip. Also, the guard rings can prevent damage to the components within an active area of the integrated circuit due to cracking that may form during the dicing process.

More specifically, after formation of the active and passive components, the wafer is cut or diced into individual integrated circuit chips, either by sawing or by scribing and breaking. During the cutting or dicing process, the wafer is subjected to high shear stresses which can cause cracks extending inwardly from the edges of each chip. Due to the stresses encountered when dicing the chip, or even later during use, cracks can propagate inward from the edges of the chip and eventually reach the active portion of the chip, damaging semiconductor devices disposed in the active region. Guard rings, though, can prevent the propagation of cracks from reaching the active region of the chip.

Guard rings, though, can be damaged due to dicing issues. Also, guard rings use valuable real estate on the integrated circuit.

SUMMARY

In an aspect of the invention, a structure comprises a crack stop structure formed in one or more dielectric layers and surrounding an active region of an integrated circuit chip. The crack stop comprises self healing material which, upon propagation of a crack, is structured to seal the crack and prevent further propagation of the crack.

In an aspect of the invention, a structure comprises a chip comprising an active region with active and passive devices. The structure further comprises a crack stop structure surrounding the active region, located about a perimeter of the chip and within one or more layers of dielectric material. The crack stop structure includes encapsulated self healing material within a resin matrix having a catalyst.

In an aspect of the invention, a method of forming a crack stop structure, comprises: forming one or more openings within one or more layers of dielectric material of an integrated circuit, the one or more openings being formed around a perimeter of the integrated circuit surrounding an active region; and filling the one or more openings with self healing material within a resin matrix.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the self-healing crack stop structure of the present invention. In still further embodiments, a method in a computer-aided design system is provided for generating a functional design model of the self-healing crack stop structure. The method comprises generating a functional representation of the structural elements of the self-healing crack stop structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to a self-healing crack stop structure and methods of manufacture. More specifically, the present invention is directed to a replacement structure for conventional crack stops, guard rings, or other moisture oxidation barriers (MOB) using a self-healing material. Advantageously, the self-healing crack stop structure provides the same functionality as the conventional crack stop structures, e.g., guard rings and MOBs, as well as additional functionality due to the nature of the self-healing materials, e.g., allowing the crack stop to heal itself. As to the latter feature, the self-healing materials allow cracks in the crack stop to automatically be repaired. The self-healing crack stop structure also frees up valuable silicon real estate on a chip or die.

In embodiments, the self-healing materials include resin-filled microcapsules that upon rupture, can fill in a crack. That is, upon a crack propagating into the self-healing crack stop structure of the present invention, the self-healing material will substantially fill the crack to prevent further crack propagation. In embodiments, the self-healing materials can include a catalyst in order to expedite healing, e.g., allow a lower activation energy thereby allowing the polymerization reaction to occur at room temperature.

The self-healing crack stop structure can take many different forms such as, for example, vias along an edge of the die or a wall of material. These structures can be formed on all or any combination of levels of the integrated circuit, and can be manufactured using many different methods such as etching and/or laser ablation methods, followed by a filling of the vias or trenches to form the edge vias or wall. The structures of the present invention can be formed prior to or after dicing operations.

Figure 1:
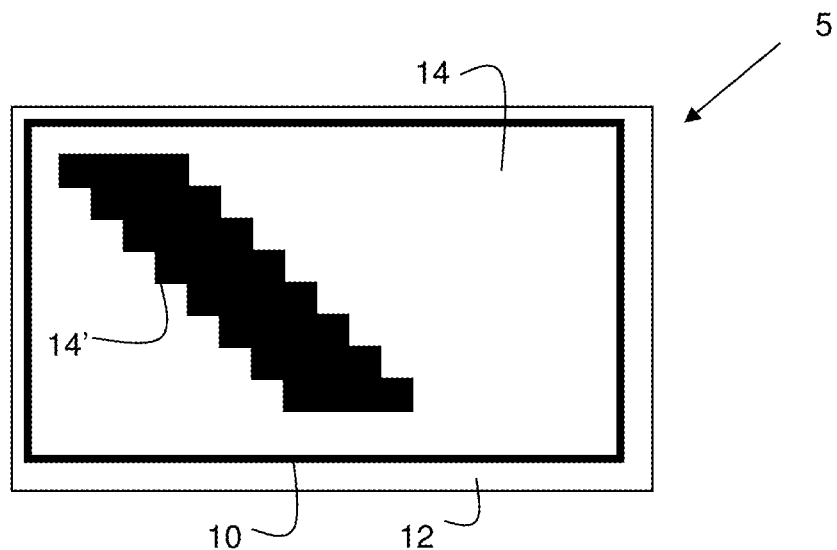
FIG. 1 shows a top view of a self-healing crack stop structure in accordance with aspects of the present invention.

FIG. 1 shows a top view of a structure in accordance with aspects of the present invention. More specifically, the structure 5 includes a self-healing crack stop structure 10 formed about a perimeter of a die (chip) 12. In more specific embodiments, the self-healing crack stop structure 10 is formed about a perimeter of an active area 14 of the chip 10. The active area 14 includes passive and active components as depicted by reference numeral 14'. For example, the active components can be transistors, diodes, etc.; whereas, the passive components can be wiring structures and metal vias.

In embodiments of the present invention, the self-healing crack stop structure 10 is depicted as a wall structure. That is, the self-healing crack stop structure 10 completely surrounds the active area 14 about an edge perimeter of the chip 12. As should be understood by those of skill in the art, the self-healing crack stop structure 10 can extend through the wiring layers to an underlying substrate. Alternatively, the self-healing crack stop structure 10 can extend through any combination of the wiring layers. The self-healing crack stop structure 10 prevents delamination of the various wiring layers of the integrated circuit chip and other edge damage that may occur during "dicing" of individual integrated circuit chips 12, as well as protects the active area 14 of the chip 12 from moisture, mobile ions, and other mechanical damage.

As in any of the aspects of the present invention, the self-healing crack stop structure 10 includes self-healing material, e.g., sealing agent or sealing compound. Although the present invention contemplates any known self-healing material that is compatible with semiconductor processing conditions, an example can include monomers such as dicyclopentadiene (DCPD) with Grubbs' catalyst embedded in an epoxy resin. Illustratively, the healing material can comprise a capsule of thermoset polymer or a glass sphere filled with DCPD in an organic matrix with Grubb's catalyst in a resin.

As should be known to those of skill in the art, Grubbs' catalysts are a series of transition metal carbene complexes used as catalysts. In contrast to other olefin metathesis catalysts, Grubbs' catalysts tolerate other functional groups in the alkene, are air-tolerant and are compatible with a wide range of solvents. A non-limiting illustrative example of a Grubbs' catalyst contemplated by the present invention is unsaturated N-heterocyclic carbene (1,3-bis(2,4,6-trimethylphenyl)imidazole)). Another catalyst contemplated by the present invention can be saturated N-heterocyclic carbene (1,3-bis(2,4,6-trimethylphenyl)dihydroimidazole).

By way of a feasibility example, the present invention contemplates materials compatible with semiconductor processing such as $C_{10}H_{12}$. $C_{10}H_{12}$ has the following properties that are compatible with semiconductor processing:

Boiling Point: 328° F. (170° C.);
Density: 980.00 kg/m$^3$;
Molar Mass: 122.2 g/mol; and
Melting Point: 90.5° F. (22.5° C.).

Figure 2:
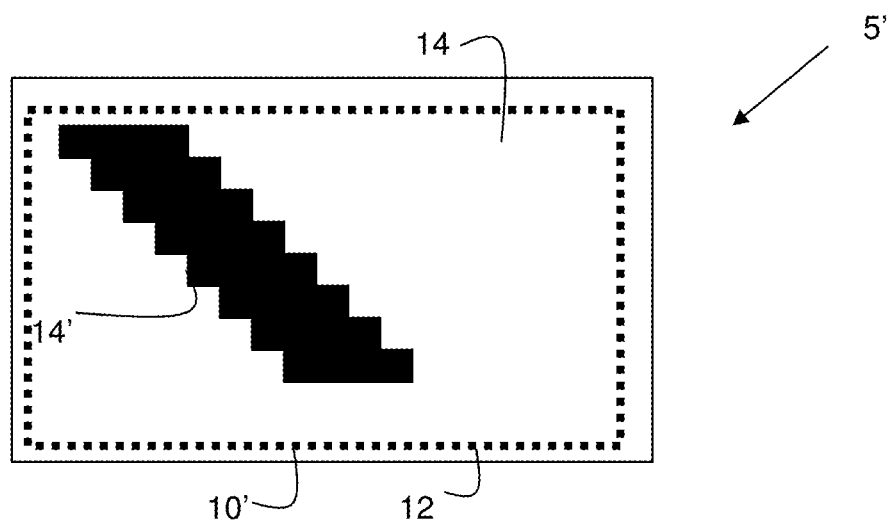
FIG. 2 shows a top view of an alternative self-healing crack stop structure in accordance with aspects of the present invention.

FIG. 2 shows a top view of a structure in accordance with aspects of the present invention. More specifically, the structure 5' includes a self-healing crack stop structure 10' formed about a perimeter of the die (chip) 12. In more specific embodiments, the self-healing crack stop structure 10' includes a plurality of vias formed about a perimeter of the active area 14 of the chip 12. That is, the self-healing crack stop structure 10' completely surrounds the active area 14 about an edge perimeter of the chip 12, with intermittent spacing therebetween, e.g., a spacing of about 1 μm to 10 μm or less; although other spacing may also be provided depending on design specifications and/or photolithographic capability. In embodiments, this spacing is sufficient to prevent propagation of cracks that may occur during the dicing operations or subsequent module processing operations that can cause cracking, as well as protect the active area 14 of the chip 12 from moisture, mobile ions, and other mechanical damage.

As should be understood by those of skill in the art, the self-healing crack stop structure 10' can extend through any combination of the wiring layers, to an underlying substrate. The underlying substrate can be, for example, silicon on insulator (SOI) or BULK materials. As in the aspect of the invention shown in FIG. 1, the self-healing crack stop structure 10' includes self-healing material that is compatible with semiconductor processing conditions. Illustratively, the healing material can comprise a capsule of thermoset polymer or a glass sphere filled with DCPD in an organic matrix with Grubb's catalyst or other materials described herein.

Figures 3A, 3B, 3C:
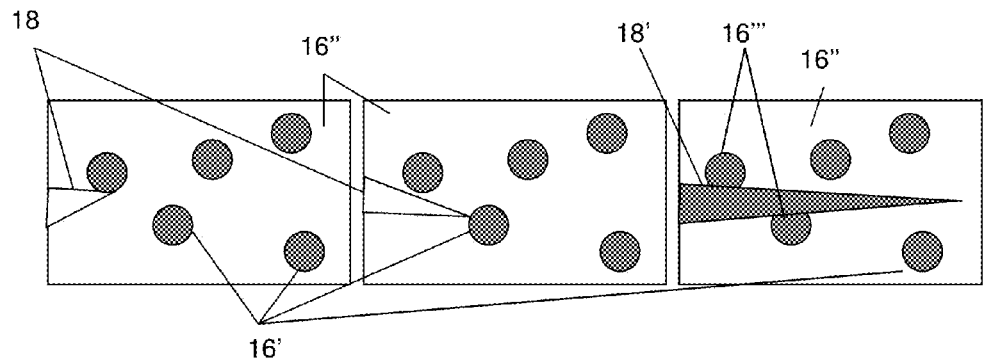
FIGS. 3a-3c are a series of steps representing self-healing properties of the self-healing crack stop structures of the present invention.

FIGS. 3a-3c are a series of steps representing self-healing properties of the self-healing crack stop structures of the present invention. In these representations, the self-healing crack stop structures comprise microcapsules of thermoset polymer or a glass sphere filled with DCPD 16' in an organic matrix (resin) with Grubb's catalyst 16"; although other materials are also contemplated by the present invention.

FIG. 3a shows a crack 18 propagating adjacent to microcapsules of thermoset polymer or glass sphere 16', within the resin 16". FIG. 3b shows further propagation of the crack 18 within the resin 16", now contacting one or more microcapsules of thermoset polymer or glass sphere 16'. FIG. 3c shows the crack breaking the one or more microcapsules of thermoset polymer or glass sphere 16'''. In this latter stage, the monomer bleeds from the one or more microcapsules of thermoset polymer or a glass sphere 16" and mends the crack by a polymerization process as shown at reference numeral 18'. That is, the self-healing material, upon a crack propagating into the structure, bleeds from the capsule, mixes with the catalyst 16''' and polymerizes to fill the crack and prevent further crack propagation as represented by reference numeral 18'. The presence of the catalyst allows for the activation energy to be lowered, and the polymerization reaction to occur at room temperature.

Figure 4:
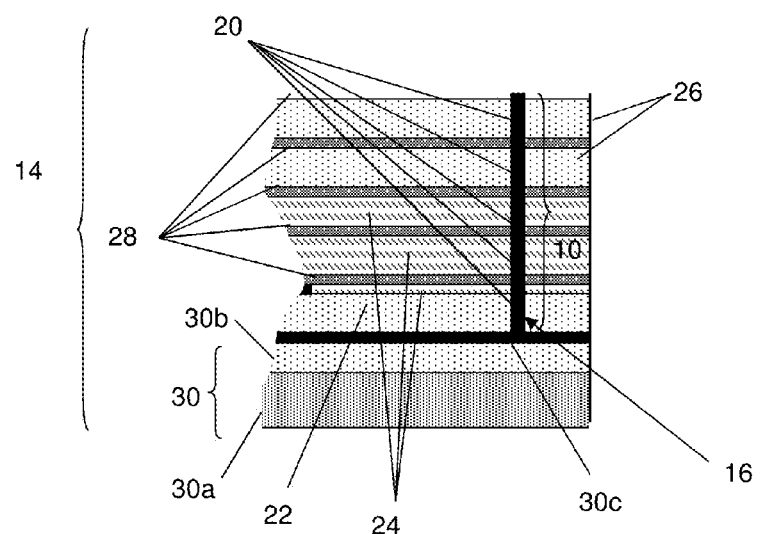
FIG. 4 shows processing steps and a respective structure in accordance with additional aspects of the present invention.

FIG. 4 shows processing steps and a respective structure in accordance with aspects of the present invention. As shown in FIG. 4, for example, the self-healing crack stop structure is generally represented by reference numeral 10. The self-healing crack stop structure 10 can be a wall or series of vias surrounding the active area 14. As should be understood by those of skill in the art, the wall would completely surround the active area 14 of the chip providing complete blockage; whereas, a series of vias would be intermittently spaced about the active area 14. In any of the embodiments, the self-healing crack stop structure 10 can be provided on any combination of wiring layers; although, FIG. 4 shows a non-limiting example using all wiring layers. In any of the implementations, the manufacturing processes would be very similar, including etching of individual layers to form vias or trenches 20 and filling the vias or trenches 20 with self-healing material 16.

The plurality of vias or trenches 20 are formed within interlevel dielectric layers 22, 24 and 26. By way of illustration, the vias or trenches 20 can be formed individually through each dielectric layer 22, 24, 26 and passivation layers 28. In embodiments, the dielectric layers 24 are composed of SiCOH; whereas, the dielectric layer 22 is composed of borophosphosilicate glass (BPSG) and dielectric layers 26 are composed of $SiO_2$. In alternative or additional embodiments, the dielectric layers 22, 24 can be any combination of $SiO_2$, SiN, undoped or doped silicate glasses, such as BPSG, fluorosilicate glass (FSG), and phosphosilicate glass (PSG), and low-k (dielectric constant) or ultra low-k dielectric materials, such as hydrogen silsesquioxane polymer (HSQ), methyl silsesquioxane polymer (MSQ), organosilicate glass (Si- COH), and porous SiCOH. The dielectric layer 26 can also be other dielectric materials, taking into consideration the fragility of the materials. That is, the material for the dielectric layer 24 should not be too fragile as this layer is subject to stresses imposed from packaging processes. Each of the dielectric layers 22, 24 and 26 can be formed using conventional deposition and patterning processes, e.g., chemical vapor deposition (CVD), lithography and etching processes.

In the processes of forming the vias or trenches 20, in separate processes after deposition and patterning of individual dielectric layers, a resist is formed on a respective dielectric layer. The resist is exposed to energy (light) to form a pattern (opening). The respective exposed dielectric layer then undergoes a conventional reactive ion (RIE) process to form a via or trench 20 within each layer. The self-healing material 16 can then be deposited within the via or trench 20. For example, the self-healing material 16 can be injected or pushed/squeezed into the via or trench 20 using a doctors blade or squeegee, as examples. A passivation layer 28, e.g., SiN, SiCN or SiC, etc. is deposited on each of the respective dielectric layers using a conventional CVD process, for example, to protect metal wiring during subsequent fabrication processing.

As alternative manufacturing processes, the vias or trenches 20 can be fabricated after the deposition and patterning of all of the dielectric layers and passivation layers. In this alternative embodiment, the vias or trenches 20 are formed in a single or multiple selective etching processes, after all of the wiring layers are formed. In yet further embodiments, the vias or trenches 20 can be formed by laser ablation techniques and then filled with the self-healing material 16. In yet further embodiments, the chip can be diced first, and the edges sprayed with the self-healing material 16. In still further embodiments, the self-healing material 16 can be built above or within any of the layers of the structure, e.g., layers 22, 24, 26 and 28.

Still referring to FIG. 4, the self-healing crack stop structure 10 can be implemented in either an SOI or BULK wafer, both represented as reference numeral 30. In the SOI wafer implementation, for example, an insulation layer (e.g., BOX) 30*b* is formed on top of a wafer (bulk substrate) 30*a*, with an active semiconductor layer 30*c* (e.g., active silicon) formed on the BOX 30*b*. In embodiments, the constituent materials of the SOI wafer 30 may be selected based on the desired end use application of the semiconductor device. For example, the BOX 30*b* may be composed of oxide, such as $SiO_2$. Moreover, the active semiconductor layer 30*c* can be comprised of various semiconductor materials, such as, for example, Si, SiGe, SiC, SiGeC, etc. The SOI wafer 30 may be fabricated using techniques well known to those skilled in the art, e.g., oxygen implantation (e.g., SIMOX), wafer bonding, etc.

It should be understood by those of skill in the art that FIGS. 1-4 show various respective structures and related processing steps in accordance with various aspects of the present invention. As should be understood by those of skill in the art, each of the structures formed in FIGS. 1-4 can be fabricated using conventional CMOS processes as described herein. Also, any of the structures shown in FIGS. 1-4 can be provided in any combination. By way of example, the self-healing crack stop structure can be formed as both a wall and a plurality of vias, depending on the design parameters and specification of the integrated circuit.

Figure 5:
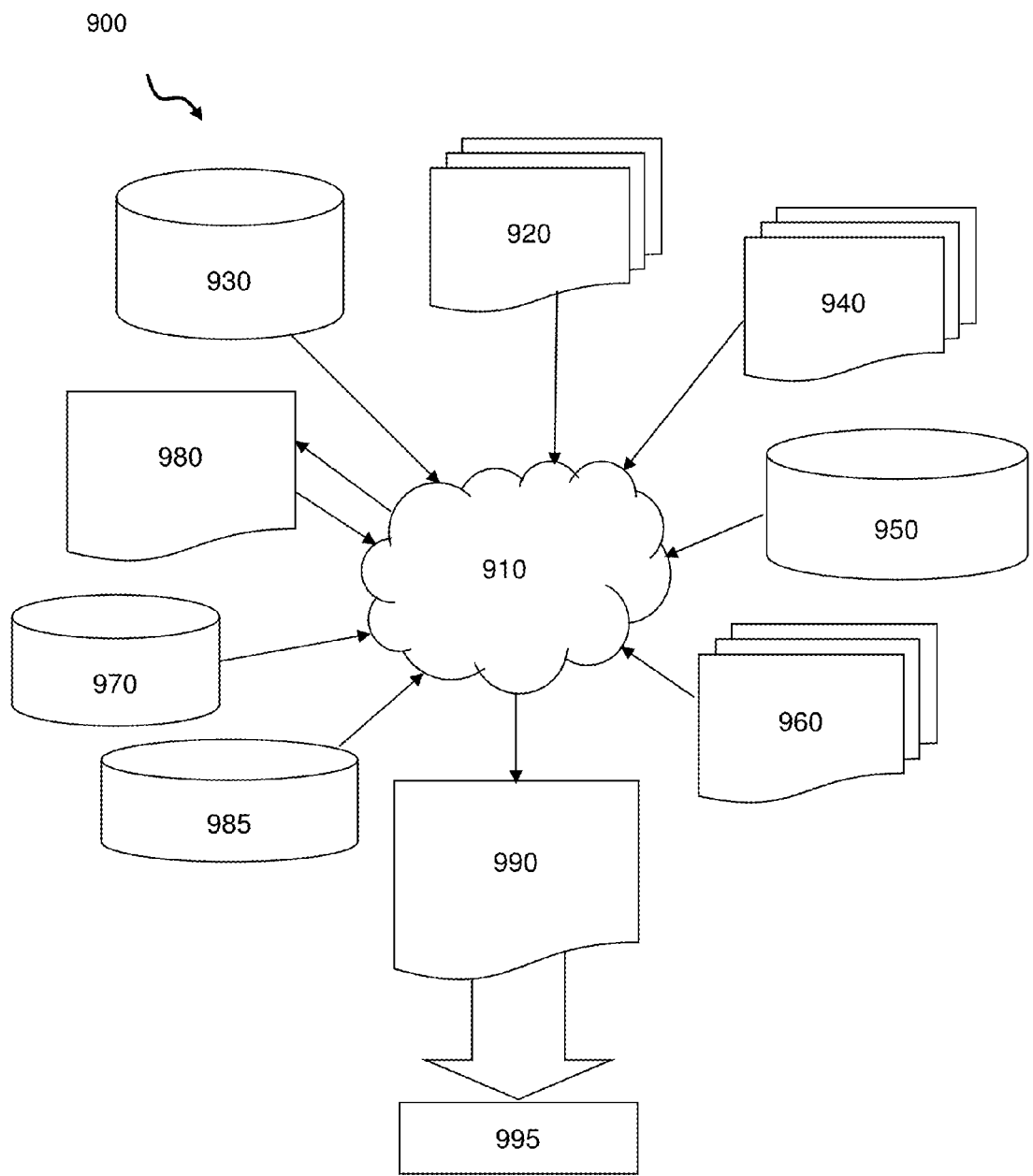
FIG. 5 is a flow diagram of a design process used in semiconductor design, manufacture, and/or test.

FIG. 5 is a flow diagram of a design process used in semiconductor design, manufacture, and/or test. FIG. 5 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-4. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-4. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-4 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 22 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4. In one embodiment, design structure 990 may comprise a compiled, executable HDL simulation model that functionally simulates the devices shown in FIGS. 1-4.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising a crack stop structure formed on one or more dielectric layers on outermost edge surfaces of a diced integrated circuit chip to completely surround an active region of the diced integrated circuit chip, the crack stop comprising self healing material which, upon propagation of a crack, is structured to seal the crack and prevent further propagation of the crack.

2. The structure of claim 1, wherein the crack stop structure is a wall surrounding the active region of the diced integrated circuit chip.

3. The structure of claim 2, wherein the crack stop structure is provided on all wiring levels of the diced integrated circuit chip.

4. The structure of claim 2, wherein the crack stop structure comprises the self healing material within a resin matrix.

5. The structure of claim 4, wherein the resin matrix includes a catalyst to polymerize the self healing material.

6. The structure of claim 5, wherein the catalyst is a Grubbs' catalyst in a resin.

7. The structure of claim 1, wherein the self healing material is provided in a glass sphere.

8. The structure of claim 7, wherein the glass sphere is filled with dicyclopentadiene, surrounded by the catalyst.

9. A structure comprising:
   a diced integrated circuit chip comprising an active region with active and passive devices; and
   a crack stop structure formed on one or more dielectric layers on outermost edge surfaces of the diced integrated circuit chip to completely surround the active region of the diced integrated circuit chip, the crack stop structure including encapsulated self healing material within a resin matrix having a catalyst.

10. The structure of claim 9, wherein the crack stop structure is a wall surrounding the active region of the diced integrated circuit chip.

11. The structure of claim 9, wherein the crack stop structure is provided on multiple wiring levels of the active region of the diced integrated circuit chip.

12. The structure of claim 11, wherein the crack stop structure is provided on all wiring levels of the diced integrated circuit chip, extending to an underlying substrate.

13. The structure of claim 9, wherein the self healing material is provided in a capsule of thermoset polymer or a glass sphere and the catalyst is a Grubbs' catalyst.

14. The structure of claim 13, wherein the self healing material is dicyclopentadiene.

* * * * *